United States Patent
Hausmann et al.

(10) Patent No.: US 10,643,889 B2
(45) Date of Patent: May 5, 2020

(54) PRE-TREATMENT METHOD TO IMPROVE SELECTIVITY IN A SELECTIVE DEPOSITION PROCESS

(71) Applicant: Lam Research Corporation, Fremont, CA (US)

(72) Inventors: Dennis Hausmann, Lake Oswego, OR (US); Elham Mohimi, Hillsboro, OR (US); Pengyi Zhang, Tigard, OR (US); Paul C. Lemaire, Raleigh, NC (US); Kashish Sharma, Fremont, CA (US); Alexander R. Fox, Portland, OR (US); Nagraj Shankar, Tualatin, OR (US); Kapu Sirish Reddy, Portland, OR (US); David Charles Smith, Lake Oswego, OR (US)

(73) Assignee: Lam Rasearch Corporation, Fremont, CA (US)

( * ) Notice: Subject to any disclaimer, the term of this patent is extended or adjusted under 35 U.S.C. 154(b) by 0 days.

(21) Appl. No.: 16/056,260

(22) Filed: Aug. 6, 2018

(65) Prior Publication Data
US 2020/0043776 A1 Feb. 6, 2020

(51) Int. Cl.
*H01L 21/768* (2006.01)
*H01L 21/321* (2006.01)
*H01L 21/02* (2006.01)

(52) U.S. Cl.
CPC .... *H01L 21/76829* (2013.01); *H01L 21/0228* (2013.01); *H01L 21/02614* (2013.01); *H01L 21/3212* (2013.01); *H01L 21/76879* (2013.01)

(58) Field of Classification Search
CPC ......... H01L 21/76829; H01L 21/02614; H01L 21/76879; H01L 21/0228; H01L 21/3212; H01L 21/76849; H01L 21/76873; H01L 21/2885
See application file for complete search history.

(56) References Cited

U.S. PATENT DOCUMENTS

| | | | |
|---|---|---|---|
| 2006/0033678 A1 * | 2/2006 | Lubomirsky | C23C 16/06 345/32 |
| 2006/0108320 A1 * | 5/2006 | Lazovsky | B82Y 30/00 216/2 |
| 2013/0143401 A1 | 6/2013 | Yu et al. | |
| 2015/0214093 A1 | 7/2015 | Dordi et al. | |
| 2015/0217330 A1 * | 8/2015 | Haukka | B05D 3/107 427/343 |

(Continued)

OTHER PUBLICATIONS

Murdoch et al., "Feasibility Study of Fully Self Aligned Vias for 5nm Node BEOL", 2017 IEEE International Interconnect Technology Conference (IITC), May 2017, downloaded Aug. 6, 2018.

(Continued)

*Primary Examiner* — Phat X Cao
*Assistant Examiner* — Victor V Barzykin
(74) *Attorney, Agent, or Firm* — Beyer Law Group LLP

(57) ABSTRACT

A method of improving selectivity of a metal in a selective deposition process. A pre-treatment process for the metal modifies the metal surface, and includes first reducing the metal to remove organic contamination from the metal followed by oxidation of the metal to allow a monolayer of a metal oxide to grow on the surface. This modification of the metal allows inhibitor molecules to adsorb on the metal oxide monolayer to improve selectivity.

19 Claims, 4 Drawing Sheets

(56) References Cited

U.S. PATENT DOCUMENTS

| | | |
|---|---|---|
| 2017/0062210 A1 | 3/2017 | Visser et al. |
| 2017/0092533 A1 | 3/2017 | Chakraborty et al. |
| 2017/0114451 A1* | 4/2017 | Lecordier ................ C22B 5/12 |
| 2018/0076027 A1 | 3/2018 | Tapily et al. |

OTHER PUBLICATIONS

International Search Report and Written Opinion for International Application No. PCT/US2019/043724 dated Nov. 14, 2019.

* cited by examiner

200

```
┌─────────────────────────────────────────────────────────────────┐
│ Provide substrate having copper lines formed in dielectric layer │
│                in semiconductor processing chamber          210 │
└─────────────────────────────────────────────────────────────────┘
                              │
                              ▼
┌─────────────────────────────────────────────────────────────────┐
│ Flow NH$_3$/N$_2$ plasma into chamber to remove organic          │
│        contamination from and to reduce the copper          220 │
└─────────────────────────────────────────────────────────────────┘
                              │
                              ▼
┌─────────────────────────────────────────────────────────────────┐
│ Flow O$_2$ plasma or O$_2$ into chamber to oxidize copper and    │
│             allow monolayer of CuOx to grow                 230 │
└─────────────────────────────────────────────────────────────────┘
                              │
                              ▼
┌─────────────────────────────────────────────────────────────────┐
│ Deposit inhibitor molecules selective only to copper and allow   │
│      inhibitor molecules to be adsorbed onto the CuOx monolayer │
│                                                             240 │
└─────────────────────────────────────────────────────────────────┘
                              │
                              ▼
                           ( END )
```

FIG. 2

PRE-TREATMENT METHOD TO IMPROVE SELECTIVITY IN A SELECTIVE DEPOSITION PROCESS

BACKGROUND

The disclosure relates to a method for semiconductor processing. More specifically, the disclosure relates to a method for improving selectivity in a selective deposition process.

Fabrication of semiconductor devices typically requires interconnect structures that include metal wiring to connect devices in a semiconductor chip. The wiring includes metal lines formed in dielectric layers that extend across the chip as well as vias that connect the lines on different levels of the chip. In many applications, selective deposition is performed on substrates to form vias. The metal lines and vias are typically formed of aluminum or copper and are insulated by the dielectric.

In semiconductor fabrication, it is desirable to have a via that is fully aligned to both levels to which the via connects. When drilling down to form vias to metal lines below, if there is any misalignment, the via could potentially miss the desired metal line and instead go to another line, thereby causing a short.

In a process to form fully aligned vias, aluminum oxide ($Al_2O_3$) is typically selectively deposited on the dielectric surface as an etch stop layer after the metal lines (i.e., copper) are deposited. It is known that $Al_2O_3$ will only deposit on a dielectric surface (e.g., silicon oxide) and not on a pristine copper surface that has been exposed to inhibitor molecules. Forming vias using this selective deposition process, however, requires a pristine copper surface, such as is deposited using physical vapor deposition (PVD), which requires high operating temperatures and is also difficult for depositing on complex geometries. Current technology for modifying a copper surface to improve selectivity employs a two-step process: (1) exposing the pristine copper surface to an inhibitor; and (2) depositing $Al_2O_3$ using thermal atomic layer deposition (ALD). This process only works with copper deposited by PVD and not with copper deposited by either electrofill (EF) or EF followed by chemical mechanical polishing (CMP).

However, in processes for forming fully aligned vias, the copper is typically deposited using an EF process and is then chemically mechanically polished to form the vias. This copper deposited by the EF/CMP process does not adsorb inhibitor molecules and a subsequent ALD $Al_2O_3$ process to deposit an etch stop layer would therefore not be selective. Therefore, it would be desirable to improve selectivity in a deposition process on copper deposited by EF/CMP in a process for forming fully aligned vias.

SUMMARY

According to an embodiment, a method is provided for improving the selectivity of metal. A substrate is provided in a semiconductor processing chamber. The substrate has metal lines formed in a dielectric layer. The metal is reduced from a metal oxide to metal by removing organic contamination from the metal. The metal is then oxidized and a monolayer of metal oxide is allowed to grow on a surface of the metal after reducing the metal.

According to another embodiment, a method is provided for improving the selectivity of copper deposited by an electrofill process. A substrate is provided in a semiconductor processing chamber. The substrate has copper lines formed in a dielectric layer. The copper is reduced from a copper oxide to copper by removing organic contamination from the copper. The copper is oxidized and a monolayer of copper oxide is allowed to grow on a surface of the copper after reducing the copper. Inhibitor molecules that are selective only to the copper are deposited and the inhibitor molecules are allowed to adsorb on the monolayer of copper oxide after allowing the monolayer to grow.

According to yet another embodiment, a method is provided for improving the selectively depositing an etch stop layer. A substrate is provided in a semiconductor processing chamber. The substrate has a dielectric on its surface. Copper is deposited onto the surface of the substrate by an electrofill process. The copper is then chemically mechanically polished. A plasma mixture of ammonia and nitrogen is then flowed into the chamber to reduce the copper from a copper oxide to copper by removing organic contamination from the copper. An oxygen plasma or oxygen is flowed into the chamber to oxidize the copper and a monolayer of copper oxide is allowed to grow on a surface of the copper after reducing the copper. Thiol molecules that are selective only to the copper are deposited and the thiol molecules are allowed to adsorb on the monolayer of copper oxide after allowing the monolayer to grow. An etch stop layer is selectively deposited over the dielectric layer.

BRIEF DESCRIPTION OF THE DRAWINGS

The present disclosure is illustrated by way of example, and not by way of limitation, in the figures of the accompanying drawings and in which like reference numerals refer to similar elements and in which:

FIG. 2 is a flow chart of a method of improving the selectivity of copper deposited by an electrofill process in accordance with an embodiment.

DETAILED DESCRIPTION OF EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

The embodiments described herein relate generally to selective deposition processes. In particular, the embodiments described herein relate to pretreatment methods for improving the selectivity in a selective deposition process. Metal, such as copper, cobalt, and tungsten, can be pretreated to modify the surface of the metal to accept inhibitor molecules. By using a two-step pre-treatment, an EF/CMP copper surface, for example, can be modified to accept inhibitor molecules and enable a subsequent net selective deposition of an etch stop layer, such as $Al_2O_3$, silicon oxide ($SiO_2$), and other low-k films.

Figure 3:
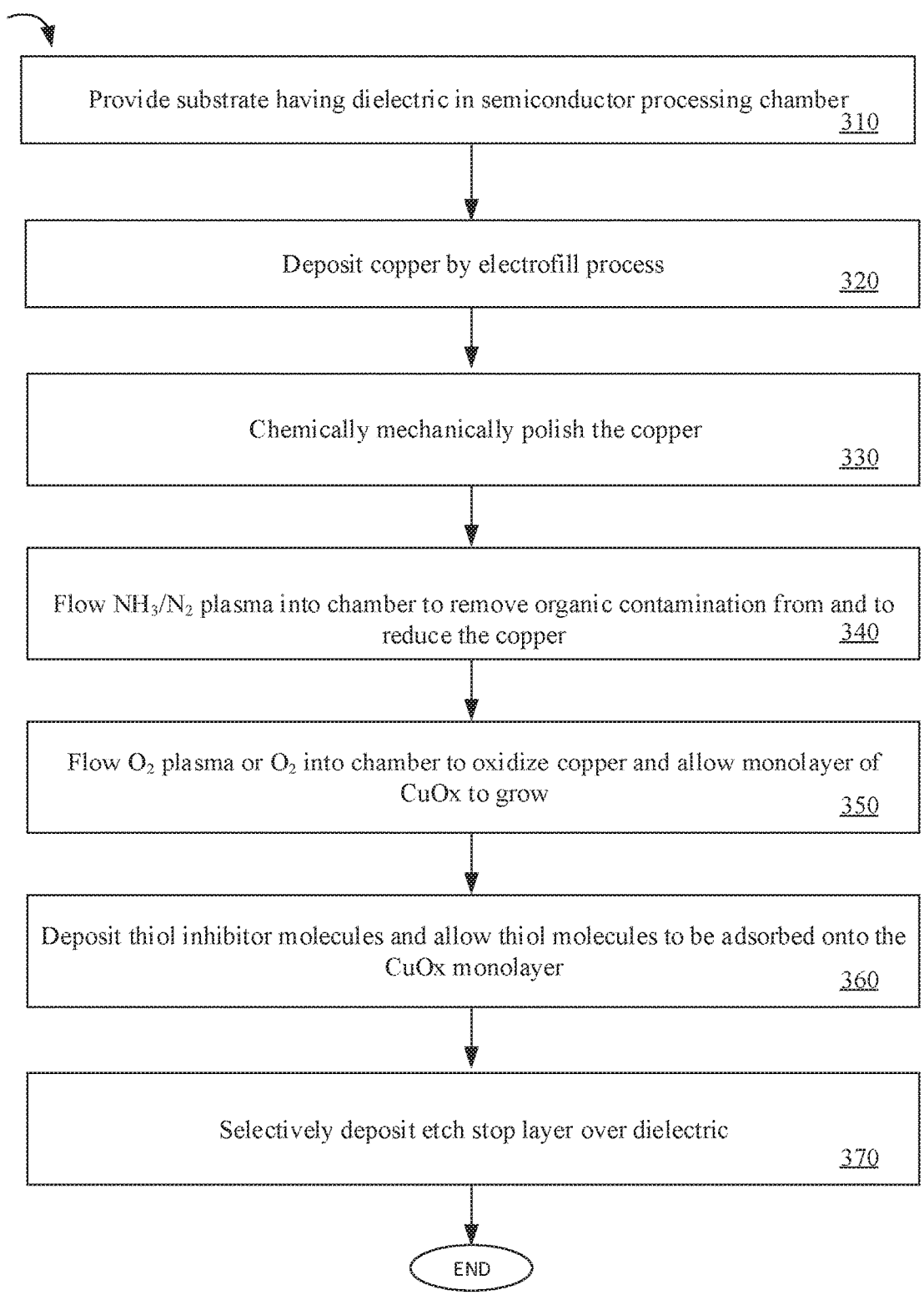
FIG. 3 is a flow chart of a method of selectively depositing an etch stop layer in accordance with an embodiment.

With reference to FIGS. 1-3, embodiments of a pre-treatment process for improving selectivity of a copper surface are described. The pre-treatment processes to improve selectivity are especially useful in processes for forming fully aligned vias. According to the embodiments described herein, a pre-treatment process modifies the surface of metal (that is not necessarily pristine) to improve selectivity. For example, copper that is deposited by EF or EF/CMP, can be modified using such a pre-treatment process to improve selectivity. As discussed in more detail below, a two-step pre-treatment process is used to improve the selectivity of metal (e.g., copper, cobalt, tungsten) deposited by EF or EF/CMP to allow for adsorption of an inhibitor to enable subsequent selective deposition on the dielectric only.

Improvement of selectivity is especially useful in processes for forming fully aligned vias. Via alignment is critical in semiconductor devices for reliability, as maximum contact is desirable and misaligned vias can result in shorting, as noted above. Typically, an electrofill process for deposition of copper lines followed by CMP of the copper lines is used in a process for forming fully aligned vias. To recess the copper lines, a dielectric layer of $Al_2O_3$ is selectively deposited over the dielectric layer (but not over the copper) as an etch stop layer. As noted above, copper that is deposited by electrofill and subsequently chemically mechanically polished does not adsorb an inhibitor and a subsequent ALD process for depositing $Al_2O_3$ would therefore not be selective.

According to embodiments described herein, a metal surface is modified to improve selectivity by: (1) removal of organic contamination for reduction of the metal, and (2) controlled oxidation following reduction. Plasmas, such as a plasma mixture of ammonia ($NH_3$) and nitrogen ($N_2$), hydrogen ($H_2$) plasma, ammonia ($NH_3$) plasma, and non-thermal diborane ($B_2H_6$) plasma, can be used to remove the organic contamination from the metal. In other embodiments, citric or acetic acid can be used for the removal of organic contamination. The controlled oxidation can be performed by exposing the metal to an oxygen ($O_2$) plasma, oxygen ($O_2$), ozone ($O_3$), or hydrogen peroxide ($H_2O_2$). The oxidation of the metal surface results in a thermally regrow a monolayer of metal oxide. The monolayer is preferably greater than 1 Å thick. It will be understood that the monolayer is ideally as thin as possible, as the metal oxide is not as conductive as pure metal and the reduced conductivity could potentially degrade the semiconductor device. The reduction and subsequent oxidation of the metal surface results in a surface that will allow adsorption of inhibitor molecules.

After oxidation, the metal is then exposed to inhibitor molecules that adsorb on the metal surface. Suitable inhibitors include thiols (e.g., butanethiols and dodecanethiols) and phosphonic acids (e.g., octadecylphosphonic acid). It will be understood that thiols will adsorb better on the modified copper surfaces and phosphonic acids will adsorb better on modified cobalt surfaces. However, wet chemistry must be used if a phosphonic acid is used as the inhibitor, as phosphonic acids are not volatile and therefore not suitable for vapor chemistry. Thiols, on the other hand, are volatile, so wet chemistry is not necessary when using thiols as the inhibitor.

According to a particular embodiment, a copper surface is modified to enable selectivity by: (1) removal of organic contamination for reduction of CuOx to Cu, and (2) controlled oxidation following reduction. $NH_3$ and $N_2$ can be co-flowed to form a plasma mixture to remove organic contamination and to reduce the copper. The copper surface is then oxidized by exposing it to an $O_2$ plasma or $O_2$ to thermally regrow a monolayer of CuOx. The monolayer is preferably greater than 1 Å thick. Although typical preparation of copper surfaces is done with a single reduction step using $NH_3/N_2$ plasma, and following such reduction with an oxidation step seems counterintuitive (in that it may appear to defeat the purpose of the initial reduction), this oxidation step is critical to achieve selectivity, as it allows the copper to adsorb inhibitor molecules, such as thiols or phosphonic acids.

Figure 1A:
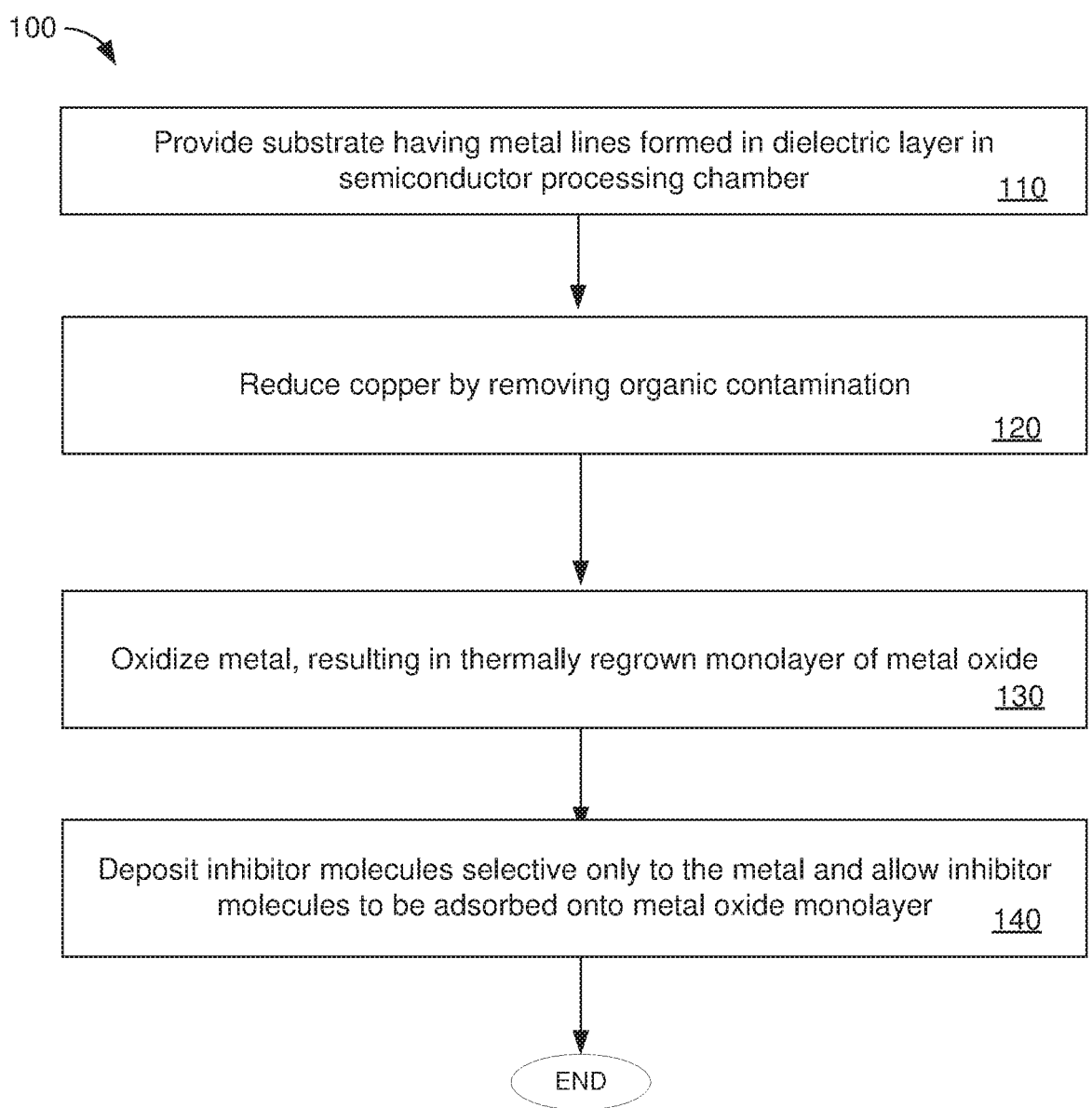
FIG. 1A is a flow chart of a method for improving the selectivity of metal in accordance with an embodiment.
Figure 1B:
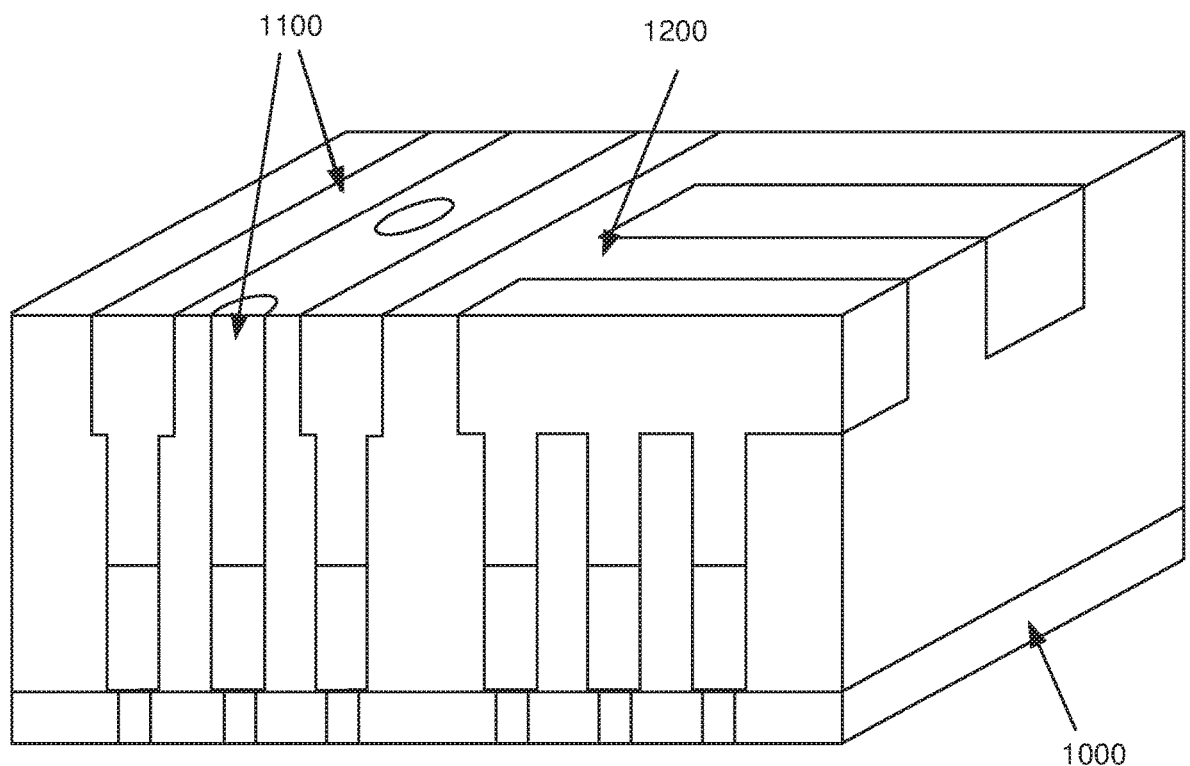
FIG. 1B shows a substrate having metal lines formed in a dielectric layer.

With reference to FIG. 1A, an embodiment of a method of improving the selectivity of metal is described. The method 100 begins with providing a substrate in a semiconductor processing chamber, the substrate having metal lines formed in a dielectric layer (e.g., silicon oxide ($SiO_2$)) in Step 110. FIG. 1B shows a substrate 1000 having metal lines 1100 formed in a dielectric later 1200. The metal is deposited by an electrofill process and may be then chemically mechanically polished. In Step 120, the metal is reduced from a metal oxide to metal by removing organic contamination from the metal. In Step 130, the metal is oxidized, resulting in a thermally regrown monolayer of metal oxide. After the monolayer of metal oxide is regrown, inhibitor molecules that are selective only to the metal are deposited in Step 140. The thermally regrown monolayer of metal oxide allows for inhibitor molecules to adsorb and the resulting metal oxide layer therefore has improved selectivity compared with the metal surface before the pre-treatment steps 120-140.

With reference to FIG. 2, an embodiment of a method of improving the selectivity of copper deposited by an electrofill process is described. The method 200 begins with providing a substrate in a semiconductor processing chamber, the substrate having copper lines formed in a dielectric layer in Step 210. The copper is deposited by an electrofill process. In some embodiments, the copper is chemically mechanically polished after the electrofill process. In Step 220, a $NH_3/N_2$ plasma is flowed into the chamber to remove organic contamination from and to reduce the copper from a CuOx to Cu. In Step 230, an $O_2$ plasma or $O_2$ is flowed into the chamber to oxidize the copper. If $O_2$ plasma is used for oxidation, the $O_2$ plasma is flowed into the chamber for about 1-5 seconds. If $O_2$ is used for oxidation, the time that the $O_2$ is flowed into the chamber can range from minutes to hours. It will be understood that higher temperatures can be used to increase the rate of oxidation. The oxidation results in a thermally regrown monolayer of CuOx. After the monolayer of CuOx is regrown, inhibitor molecules that are selective only to the copper are deposited in Step 240. According to an embodiment, thiol molecules are deposited as the inhibitor. The thermally regrown monolayer of CuOx allows for inhibitor molecules to adsorb and the resulting copper layer therefore has improved selectivity compared with the copper surface before the pre-treatment steps 220-240.

According to other embodiments, some other suitable pre-treatment options for removing organic contaminants to reduce the metal include hydrogen plasma, ammonia plasma, non-thermal diborane plasma, citric acid, and acetic acid. In addition to oxygen plasma and oxygen ($O_2$), other suitable pre-treatment options for oxidizing the reduced metal include exposing the substrate to a 20% oxygen and nitrogen gas mixture for about five minutes at room temperature (i.e., ambient air), ozone ($O_3$), and hydrogen peroxide ($H_2O_2$). It will be understood that the pre-treatment process includes a reduction step followed by an oxidation step and different combinations of the reduction and oxidation methods may be used.

The pre-treatment processes described herein can be performed in a reactor, such as the Striker® and Vector® Deposition Reactors, which is made by Lam Research Corporation of Fremont, Calif.

FIG. 3 is a flow chart of another embodiment of a method 300 of selectively depositing an etch stop layer. The method 300 begins with providing a substrate in a semiconductor processing chamber, the substrate having a dielectric on its surface in Step 310. In Step 320, copper is deposited by an electrofill process. The electrofilled copper can then be chemically mechanically polished in Step 330. In Step 340, a $NH_3/N_2$ plasma is flowed into the chamber to remove organic contamination from and to reduce the copper from a CuOx to Cu. In Step 350, an $O_2$ plasma or $O_2$ is flowed into the chamber to oxidize the copper. The oxidation results in a thermally regrown monolayer of CuOx. After the monolayer of CuOx is regrown, thiol inhibitor molecules are deposited and adsorbed onto the CuOx layer in Step 360. The thermally regrown monolayer of CuOx allows for inhibitor molecules to adsorb and the resulting copper layer therefore has improved selectivity compared with the copper surface before the pre-treatment steps 340-360. In Step 370, an etch stop layer is selectively deposited over the dielectric. In accordance with an embodiment, the etch stop layer is an $Al_2O_3$ layer. In some embodiments, the $Al_2O_3$ layer is deposited using a thermal atomic layer deposition (ALD) process. However, it will be understood that other deposition methods may be used to deposit the $Al_2O_3$ layer. Typically, thermal processes are used to deposit the etch stop layer as they do not damage the inhibitor molecules. It will be understood that a plasma deposition process may damage the inhibitor molecules, thereby compromising the selectivity.

Although only a few embodiments of the invention have been described in detail, it should be appreciated that the invention may be implemented in many other forms without departing from the spirit or scope of the invention. In view of all of the foregoing, it should be apparent that the present embodiments are illustrative and not restrictive and the invention is not limited to the details given herein, but may be modified within the scope and equivalents of the appended claims.

What is claimed is:

1. A method for improving the selectivity of metal, the method comprising:
   providing a substrate in a semiconductor processing chamber, the substrate having metal lines formed in a dielectric layer;
   reducing the metal from a metal oxide to metal by removing organic contamination from the metal; and
   oxidizing the metal by flowing $O_2$ or $O_2$ plasma into the semiconductor processing chamber and allowing a monolayer of metal oxide to thermally grow on a surface of the metal after reducing the metal.

2. The method as recited in claim 1, further comprising depositing inhibitor molecules that are selective only to the metal and allowing the inhibitor molecules to adsorb on the monolayer of metal oxide after allowing the monolayer to grow.

3. The method as recited in claim 1, wherein the metal is deposited by an electrofill process.

4. The method as recited in claim 3, wherein the metal is chemically mechanically polished after it is deposited.

5. The method as recited in claim 1, wherein the metal is selected from the group consisting of copper, cobalt, and tungsten.

6. The method as recited in claim 1, wherein the dielectric layer comprises silicon oxide.

7. The method as recited in claim 1, wherein reducing comprises flowing hydrogen plasma, a plasma mixture of ammonia and nitrogen, ammonia plasma, a non-thermal diborane plasma, citric acid, or acetic acid into the chamber.

8. The method as recited in claim 1, wherein oxidizing comprises flowing an oxygen plasma, oxygen, ozone, or hydrogen peroxide into the chamber.

9. The method as recited in claim 2, wherein the inhibitor molecules comprise a thiol or phosphonic acid.

10. A method for improving the selectivity of copper deposited by an electrofill process, the method comprising:
    providing a substrate in a semiconductor processing chamber, the substrate having copper lines formed in a dielectric layer;
    reducing the copper from a copper oxide to copper by removing organic contamination from the copper;
    oxidizing the copper by flowing $O_2$ or $O_2$ plasma into the semiconductor processing chamber and allowing a monolayer of copper oxide to thermally grow on a surface of the copper after reducing the copper; and
    depositing inhibitor molecules that are selective only to the copper and allowing the inhibitor molecules to adsorb on the monolayer of copper oxide after allowing the monolayer to grow.

11. The method as recited in claim 10, wherein the copper is chemically mechanically polished after the electrofill process and before reducing the copper.

12. The method as recited in claim 10, wherein the dielectric layer comprises silicon oxide.

13. The method as recited in claim 10, wherein reducing comprises flowing hydrogen plasma, a plasma mixture of ammonia and nitrogen, ammonia plasma, a non-thermal diborane plasma, citric acid, or acetic acid into the chamber.

14. The method as recited in claim 10, wherein oxidizing comprises flowing an oxygen plasma, oxygen, ozone, or hydrogen peroxide into the chamber.

15. The method as recited in claim 10, wherein the inhibitor molecules comprise a thiol.

16. A method for improving the selectively depositing an etch stop layer, the method comprising:
    providing a substrate in a semiconductor processing chamber, the substrate having a dielectric on its surface;
    depositing copper onto the surface of the substrate by an electrofill process;
    chemically mechanically polishing the copper deposited by the electrofill process;
    flowing a plasma mixture of ammonia and nitrogen into the chamber to reduce the copper from a copper oxide to copper by removing organic contamination from the copper after chemically mechanically polishing the copper;
    flowing an oxygen plasma or oxygen into the chamber to oxidize the copper and allowing a monolayer of copper oxide to grow on a surface of the copper after reducing the copper;
    depositing thiol molecules that are selective only to the copper and allowing the thiol molecules to adsorb on the monolayer of copper oxide after allowing the monolayer to grow; and
    selectively depositing an etch stop layer over the dielectric layer.

17. The method as recited in claim 16, wherein the dielectric comprises silicon oxide.

18. The method as recited in claim 16, wherein etch stop layer comprises aluminum oxide.

19. The method as recited in claim 16, wherein the etch stop layer is deposited by a thermal atomic layer deposition process.

* * * * *